(12) United States Patent
Kim et al.

(10) Patent No.: US 9,980,376 B1
(45) Date of Patent: May 22, 2018

(54) DURABLE FLEXIBLE CIRCUIT BOARD FOR TRANSPARENT DISPLAY BOARD AND ASSEMBLING METHOD THEREOF

(71) Applicant: G-SMATT CO., LTD., Gyeonggi-do (KR)

(72) Inventors: Sung Soo Kim, Seoul (KR); Young Woo Lee, Gyeonggi-do (KR); Ho Joon Lee, Seoul (KR)

(73) Assignee: G-SMATT CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/804,079

(22) Filed: Nov. 6, 2017

(30) Foreign Application Priority Data

Nov. 23, 2016 (KR) .......................... 10-2016-0156453

(51) Int. Cl.
| H05K 1/00 | (2006.01) |
| H05K 1/03 | (2006.01) |
| H05K 1/09 | (2006.01) |
| H05K 1/14 | (2006.01) |
| H05K 3/32 | (2006.01) |

(52) U.S. Cl.
CPC ............. *H05K 1/0393* (2013.01); *H05K 1/09* (2013.01); *H05K 1/147* (2013.01); *H05K 3/32* (2013.01); *H05K 2201/09409* (2013.01); *H05K 2201/10106* (2013.01); *H05K 2203/0285* (2013.01)

(58) Field of Classification Search
CPC ........ H05K 1/0393; H05K 1/09; H05K 1/147; H05K 2201/10106; H05K 2201/09409; H05K 2203/0285; H05K 3/32
USPC .......................................... 174/254; 361/749
See application file for complete search history.

(56) References Cited

U.S. PATENT DOCUMENTS

| 2009/0178837 A1* | 7/2009 | Kawabata | .............. H05K 3/361 |
| | | | 174/261 |
| 2016/0212838 A1* | 7/2016 | Lee | ......................... H05K 1/028 |
| 2017/0083133 A1* | 3/2017 | Kang | ...................... G02F 1/133 |

FOREIGN PATENT DOCUMENTS

| JP | 07-106728 A | 4/1995 |
| JP | 2003-273476 A | 9/2003 |

(Continued)

OTHER PUBLICATIONS

Office action dated Mar. 6, 2017 from Korean Patent Office in a counterpart Korean Patent Application No. 10-2016-0156453 (all the cited references are listed in this IDS).

*Primary Examiner* — Sherman Ng
(74) *Attorney, Agent, or Firm* — The PL Law Group, PLLC (57) ABSTRACT

A durable flexible circuit board for a transparent display board is connected between a driver board provided with at least one of a power supply and a controller and a transparent plate provided with a plurality of light emitting elements. The flexible circuit board includes an electrode bonding portion provided with a plurality of signal connection terminals for transferring control signals, at least one power connection terminal for transferring electric power, and at least one dummy terminal disposed outside the signal connection terminal or the power connection terminal disposed at the outermost side. The dummy terminal resists vibration and pressure applied to the signal connection terminal or the power connection terminal disposed at the outermost side. The signal connection terminal and the power connection terminal are integrated in the flexible circuit board.

7 Claims, 9 Drawing Sheets

(56) References Cited

FOREIGN PATENT DOCUMENTS

| | | | |
|---|---|---|---|
| KR | 10-0746330 | B1 | 8/2007 |
| KR | 10-0893085 | B1 | 4/2009 |

\* cited by examiner

DURABLE FLEXIBLE CIRCUIT BOARD FOR TRANSPARENT DISPLAY BOARD AND ASSEMBLING METHOD THEREOF

CROSS REFERENCE TO RELATED APPLICATION

The present application claims priority to Korean Patent Application No. 10-2016-0156453, filed Nov. 23, 2016, the entire contents of which is incorporated herein for all purposes by this reference.

BACKGROUND

1. Field of the Invention

The present invention relates to a durable flexible circuit board for a transparent display board and an assembling method thereof.

2. Description of the Related Art

As outdoor sign boards, electronic display boards using neon lamps, cold cathode lamps (CCL), or light emitting diodes (LED) are broadly used. Meanwhile, as indoor light emitting devices, external electrode fluorescent lamps (EEFL) or cold cathode fluorescent lamps (CCFL) are used.

Neon lamps and cold cathode lamps (CCL) consume much electricity, have a risk of causing an electric shock accident or fire, and have a short lifetime because they operate at high voltages. In addition, EEFLs and CCFLs are not suitable for outdoor use because they operate on high frequency voltages and have problems of a low illumination and a short lifetime.

LED display boards are characterized in that the back surface thereof is blocked by a cover to conceal electric cables or to provide a black surface. Thus, in the case of LED display boards, light is emitted from only one surface.

Recently, light emitting devices have been used for advertising boards as well as for lighting equipment. Furthermore, as recent light emitting devices are beautifully designed, they are even used for interior decoration.

However, the above-described light emitting devices have a limitation in the design improvement because of constrains of lamp sizes and presence of accessories such as a stand that is used to support the light emitting devices.

In order to solve this problem, transparent display boards that enable electronic display boards with stylish designs are now being used. In a transparent display board, a plurality of light emitting elements is provided to a transparent electrode and operated by a controller, thereby displaying characters, diagrams, or even moving images on the transparent electrode. In the transparent display board, the light emitting elements are connected to form a certain pattern. As the light emitting elements, two-electrode, three-electrode, and four-electrode light emitting elements are usually used.

According to this conventional transparent display board, control signals for switching on and off the light emitting element, which are generated by the controller, are applied to the light emitting elements provided on the transparent electrode via a flexible circuit board. The details thereof will be described below with reference to FIG. 1.

Figure 1:
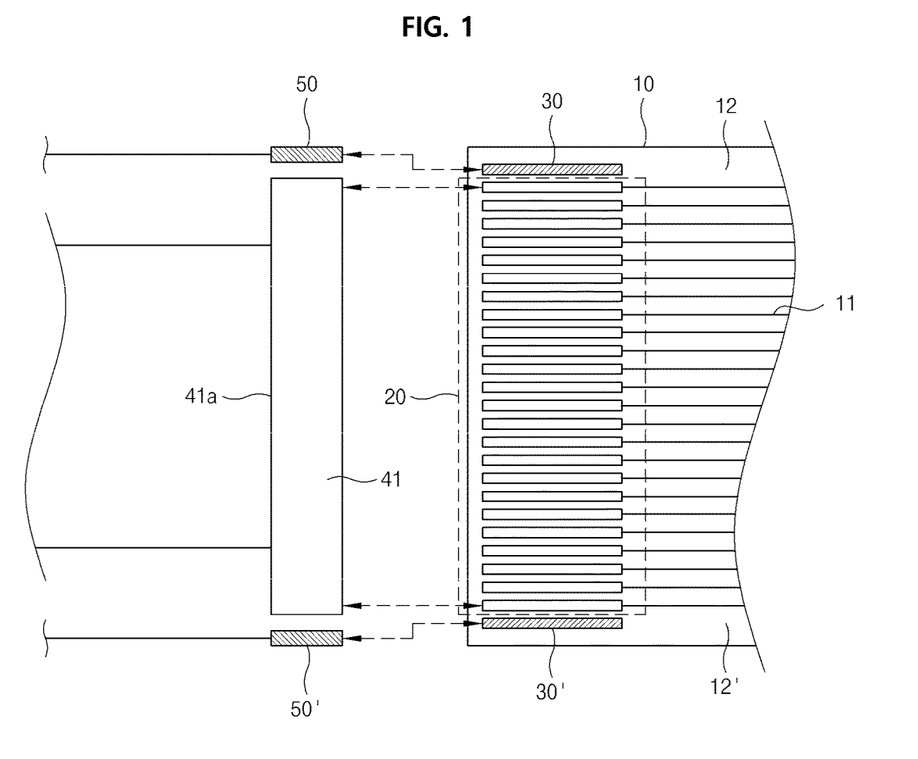
FIG. 1 is a plan view illustrating a transparent display board according to a conventional art.
Figure 2:
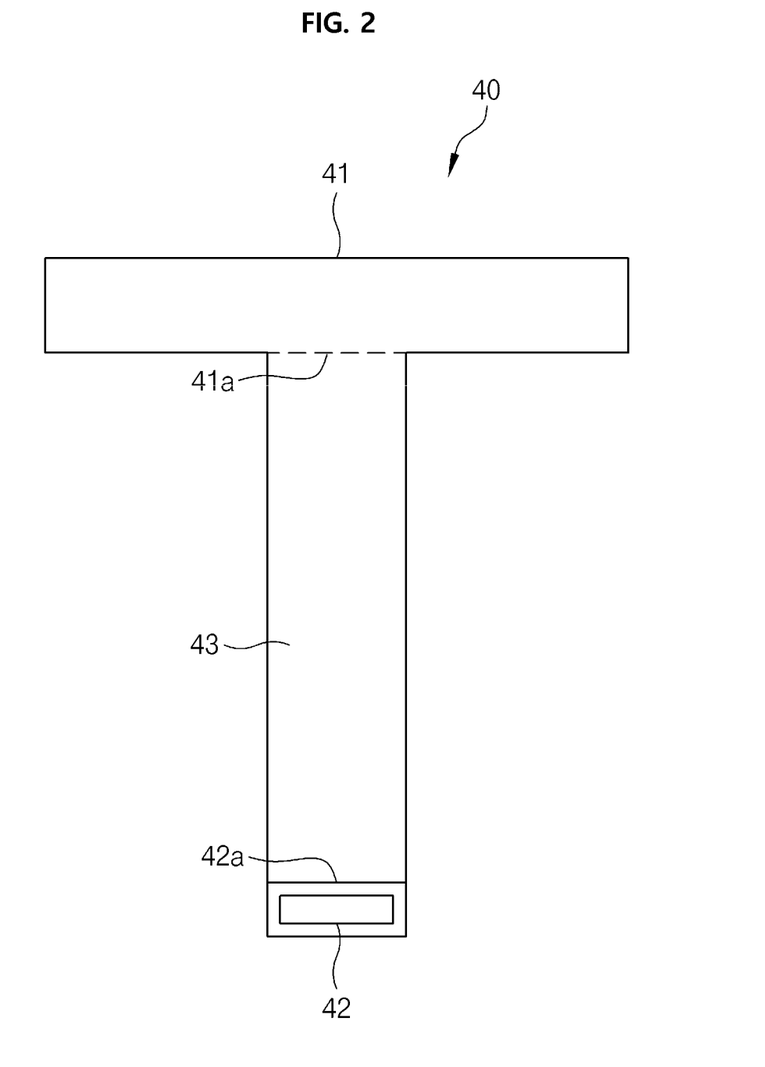
FIG. 2 is a plan view illustrating a flexible circuit board for a transparent display board, according to a conventional art.

FIG. 1 is a schematic block diagram illustrating a flexible circuit board for a transparent display board according to a conventional art, and FIG. 2 is a diagram illustrating an exemplary installation state of the conventional flexible circuit board.

With reference to FIGS. 1 and 2, the conventional transparent display board includes a transparent plate 10. One surface of the transparent plate 10 is provided with signal line patterns 11 connected to electrodes of light emitting elements (not shown), power line patterns 12 and 12' connected to a common electrode of the light emitting elements, signal connection terminals 20 provided at starting points of the signal line patterns 11, and power connection terminals 30 and 30' provided at starting points of the power line patterns 12 and 12'.

In addition, the conventional transparent display board further includes a flexible circuit board 40 for transferring control signals generated by a controller 310, and power connectors 50 and 50' for supplying electric power. That is, according to the conventional art, the flexible circuit board that transfers the control signals and the power connectors 50 and 50' that supply electric power are discrete members provided between the controller 310 and the transparent plate 10.

The signal line patterns 11 are formed by patterning a transparent electrode layer through etching or other known methods such that the signal line patterns 11 are connected to electrodes (for example, R, G, and B electrodes) of the light emitting elements. Thus, the control signals transferred via the flexible circuit board 100 can be applied to the R, G, and B electrodes of the light emitting devices through the signal line patterns 11.

The power line patterns 12 and 12' apply a positive potential or a negative potential to the common electrode of the light emitting elements other than the R, G, and B electrodes. For example, when the R, G, and B electrodes of the light emitting element are cathodes, the power line patterns 12 and 12' are connected to the anodes of the light emitting elements. Conversely, when the R, G, and B electrodes of the light emitting elements are anodes, the power line patterns 12 and 12' are connected to the cathodes of the light emitting elements.

The power line patterns 12 and 12' are arranged with the signal line patterns 11 disposed therebetween. When the signal line patterns 11 are at a negative potential, the power line patterns 12 and 12' are at a positive potential.

The connection terminals 20 and 30 consist of signal connection terminals 20 that are provided at starting points of the signal line patterns 11 and to which the flexible circuit board 40 is bonded, and power connection terminals 30 that are provided at starting points of the power line patterns 12 and 12' and are separate metal terminals for applying a positive potential to the transparent electrode.

The flexible circuit board 40 is made of a thin flexible film that can be freely bent and in which wires for electric current are provided. Therefore, the flexible circuit board 40 can transfer the control signals output from the controller 310 to the transparent plate 10.

The flexible circuit board 40 includes a transparent electrode bonding portion 41 provided with a terminal to be bonded to the signal connection terminals 20 formed on the transparent plate 10, a connector connection portion 42 provided with a connector connected to the controller 310, and a flexible portion 43 that is connected between the connector connection portion 42 and the transparent electrode bonding portion 41.

The transparent electrode bonding portion 41 and the connector connection portion 42 are made from a copper-clad hard substrate such that electric power can be transferred through the copper clad. The flexible portion 43 is physically connected between the transparent electrode bonding portion 41 and the connector connection portion 42 and is provided with embedded copper wires such that the transparent electrode bonding portion 41 and the connector connection portion 42 are electrically connected to each other.

In the conventional flexible circuit board 40, a bonded region 41a at which the substrate of the transparent electrode bonding portion 41 is bonded to the flexible portion 43 is has a size smaller than the width of the transparent electrode bonding portion 41. Similarly, a bonded region 42a at which the substrate of the connector connection portion 42 is bonded to the flexible portion 43 has a size smaller than the width of the connector connection portion.

Therefore, the flexible circuit board 40 has a problem that when the transparent electrode bonding portion 41 or the connector connection portion 42 is pulled outward, the flexible circuit board 40 is easily torn apart because it is bonded over a small area.

In addition, the conventional power connectors 50 and 50' extend from a driver board on which a power supply is mounted and are connected with the power connection terminals 30 and 30' provided on the transparent plate 10. The conventional power connectors 50 and 50' are Teflon-coated wires connected to the power connection terminals 30 and 30' that are metal terminals. The conventional power connectors 50 and 50' are arranged with one or two flexible circuit boards interposed therebetween and are provided to supply electric power to a product in which same-colored light emitting elements are mounted.

That is, in the case of the conventional display board, the power connectors 50 and 50' for supplying electric power and the flexible circuit board 40 for transferring the control signals output from the controller are separately provided. Therefore, a connection process for connecting the power connectors 50 and 50 and a connection process for connecting the flexible circuit board 40 are separately performed. For this reason, in the case of the transparent display board, since the power line patterns and the signal line patterns (flexible circuit board 40) are connected through separate connection processes, an assembling method thereof is complicated.

In addition, in the case of the conventional transparent display board, since the flexible circuit board 40 (specifically the transparent electrode bonding portion 41) is directly connected to the transparent plate 10, the power connection terminals 30 and 30' need to be provided as separate metal terminals. The power connection terminals 30 and 30' that are metal terminals cause resistance irregularity over the overall area of the transparent electrode including the signal line patterns 11 and the power line patterns 12 and 12'. For this reason, there is a problem that brightness varies according to positions of the metal power connection terminals 30 and 30'.

In addition, when bonding the flexible circuit board 40 and the power connectors 50 and 50' to the transparent plate 10, an anisotropic conductive film (ACF)) is first put on the transparent electrode of the transparent plate 10, the flexible circuit board 40 and the power connectors 50 are then stacked on the ACF, and the stacked structure is finally pressed by a hot bar.

The hot bar melts an adhesive surrounding conductive balls in the ACF, thereby causing the conductive balls to be bonded to the flexible circuit board and the power connectors.

In the bonding process of the conventional flexible circuit board, the hot bar needs to maintain a predetermined temperature for a predetermined time. Therefore, unnecessary standby energy consumption is required, and an ambient air temperature rises due to continuous heat generation, thereby deteriorating working conditions. In addition, since it takes time for the heat of the hot bar to be transferred to the ACF through the flexible circuit board, the working time is increased compared with ultrasonic bonding. That is, there is a problem that the manufacturing time is long.

In order to solve this problem, another conventional bonding method is suggested. According to this method, an anisotropic conductive film (ACF) is put on the electrodes formed on the transparent plate, the flexible circuit board is stacked on the ACF, and ultrasonic vibration is applied to the flexible circuit board. However, even though uniform pressure is applied to the signal connection terminals of the conventional flexible circuit board during the ultrasonic vibration, the pressure over an overall area of the flexible circuit board is not uniform due to the structural characteristics. Therefore, the temperature increased by the ultrasonic vibration varies according to positions within the flexible circuit board.

Specifically, in the conventional flexible circuit board, in the case of the inside signal connection terminals, each signal connection terminal has two neighboring signal connection terminals provided on both sides thereof. Therefore, the pressure applied to each signal connection terminal is uniformly distributed. However, in the case of the outermost signal connection terminals, each outermost signal connection terminal has only one neighboring signal connection terminal provided only on one side thereof. Therefore, the pressure applied thereto is not uniformly distributed. Thus, the pressure to the outermost signal connection terminals is higher than that to the inside signal connection terminals.

In addition, due to the characteristics of ultrasonic vibration, the vibration is well transferred to positions where the pressure is high and thus the temperature easily rises there. However, the vibration is not well transferred to positions where the pressure is low and thus the temperature does not easily rise there. For this reason, temperature irregularity occurs.

In conclusion, the conventional ultrasonic bonding method for the conventional flexible circuit board has problems of low bonding force and a risk of electric disconnection due to presence of locally uncured portions attributable to non-uniformity in temperature and pressure between the inside portion and the periphery portion of the flexible circuit board.

The foregoing is intended merely to aid in the understanding of the background of the present invention, and is not intended to mean that the present invention falls within the purview of the related art that is already known to those skilled in the art.

SUMMARY

Accordingly, the present invention has been made keeping in mind the above problems occurring in the related art, and an object of the present invention is to provide a durable flexible circuit board for a transparent display board, in which a signal line pattern for transferring a control signal to the transparent display board and a power line pattern for supplying electric power to the transparent display board are integrated in a single body.

Another object of the present invention is to provide a durable flexible circuit board for a transparent display board, the durable flexible circuit board being capable of reducing a temperature difference and a pressure difference between outermost connection terminals and inside connection terminals during ultrasonic bonding, thereby enabling stable power line connection and signal line connection, shortening a bonding time, and increasing a bonding force which results in improved durability thereof.

In order to accomplish the above object, the present invention provides a durable flexible circuit board for a transparent display board, the durable flexible circuit board including: a transparent plate provided with a plurality of light emitting elements that emits light in response to electric power and control signals transferred through conductive patterns formed by patterning a transparent electrode formed on one surface of the transparent plate; a driver board provided with at least one of a controller supplying the control signals to the light emitting elements and a power supply supplying electric power to the light emitting elements; and a flexible circuit board that is connected between the driver board and the transparent plate and in which signal lines to which the control signals are supplied by the controller and power lines to which electric power is supplied by the power supply are integrated with each other, wherein the flexible circuit board includes an electrode bonding portion bonded to the transparent plate and provided with a plurality of signal connection terminals transferring the control signals of the controller, at least one power connection terminal transferring electric power, and at least one dummy terminal disposed at a periphery portion thereof, the dummy terminal resisting pressure and vibration applied to the outermost signal connection terminal or the outermost power connection terminal.

As described above, the present invention improves the durability of a flexible circuit board by increasing a bonding area between a hard substrate and a flexible film. In addition, the present invention enables ultrasonic bonding of a flexible circuit board by providing a hard portion to the flexible circuit board, thereby increasing production productivity of the flexible circuit board.

In addition, according to the present invention, since power lines and signal lines are integrated in a single flexible circuit board, it is not necessary to form additional metal terminals on a transparent plate. For this reason, resistance is uniformized over an overall area of the flexible circuit board, resulting in uniform brightness of a transparent display board. Furthermore, since the power lines and the signal lines can be simultaneously connected, production productivity can be improved.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION

Hereinafter, exemplary embodiments of a transparent display board with a signal transfer device integrated with a power line will be described with reference to the accompanying drawings.

Figure 3:
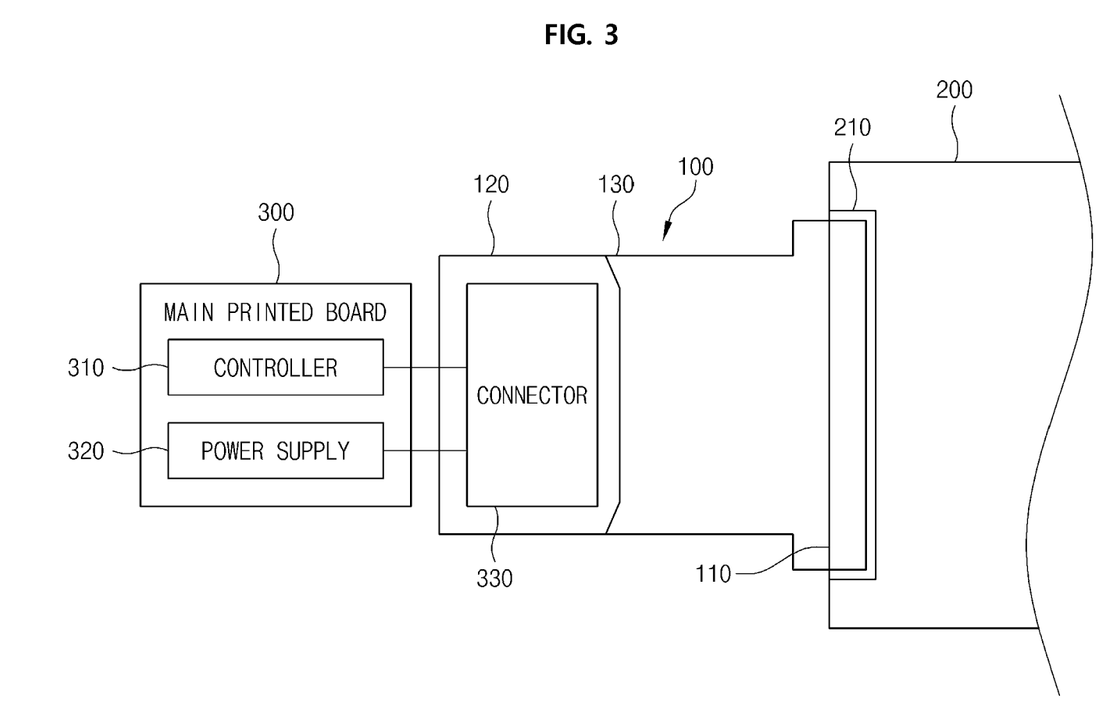
FIG. 3 is a schematic diagram illustrating a transparent display board to which a durable flexible circuit board according to one embodiment of the invention is applied.
Figure 4:
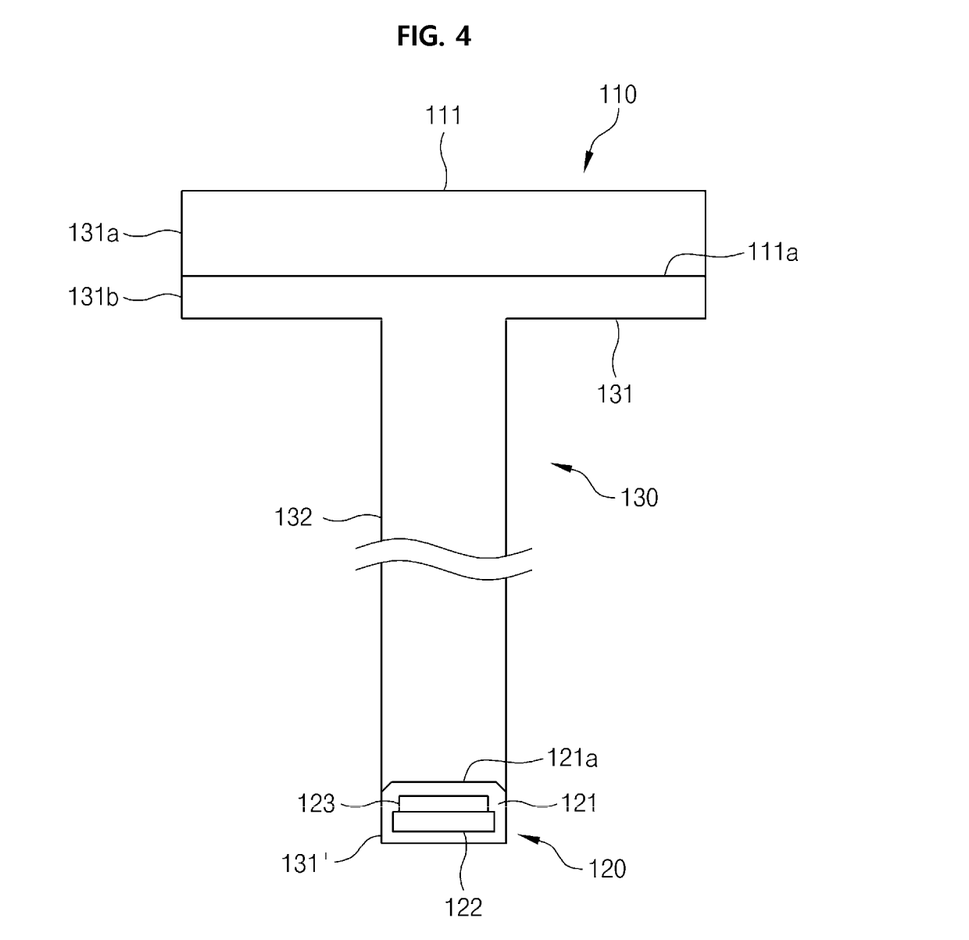
FIG. 4 is a schematic plan view illustrating the durable flexible circuit board according to the embodiment of the invention.

FIG. 3 is a schematic view illustrating a transparent display board to which a durable flexible circuit board according to one embodiment of the invention is applied and FIG. 4 is a schematic plan view illustrating the flexible circuit board according to the embodiment of the invention.

With reference to FIGS. 3 and 4, the durable flexible circuit board for a transparent display board, according to the embodiment of the invention, includes a driver board 300, a transparent plate 200 on which a plurality of light emitting elements is provided, and a flexible circuit board 100 connected between the driver board 300 and the transparent plate 200.

One surface of the driver board 300 is provided with a controller 310 and a power supply 320. The controller 310 generates control signals for controlling the light emitting elements mounted on the transparent plate 200, and the power supply 320 supplies electric power to the light emitting elements. Alternatively, the power supply 320 may be separately provided from the controller 310. That is, the power supply 320 may be installed outside the driver board 300.

One surface of the transparent plate 200 is provided with the light emitting elements. The transparent plate 200 is further provided with signal line patterns and power line patterns so that the electric power and the control signals can be transferred to the light emitting elements therethrough. The signal line patterns and the power line patterns may be formed through etching, etc. The transparent plate 200 is further provided with connection terminals 210 to which the flexible circuit board 100, connected to the driver board 300, is bonded such that the control signals and the electric power can be transferred to the signal line patterns and the power line patterns on the transparent plate therethrough.

The connection terminals 210 consist of signal patterns and power patterns. The power patterns are not provided as separate metal terminals as with conventional arts but are provided as transparent electrode patterns formed by etching a transparent electrode.

The flexible circuit board 100 includes an electrode bonding portion 110 bonded to the connection terminals 210 of the transparent plate 200, a driver connection portion 120 provided with a connector 330 connected to the driver board 300, and a flexible film portion 130 that connects the electrode bonding portion 110 and the driver connection portion 120 to each other.

The driver connection portion 120 is provided with the connector 330 and connected to the driver board 300 via the connector 330. The electrode bonding portion 110 is bonded to the connection terminals 210 connected to the signal line patterns and the power line patterns of the transparent plate 200. The flexible film portion 130 is connected to the electrode bonding portion 110 and the driver connection portion 120. The flexible film portion 130 is made from a flexible film that is freely bendable. Details of the flexible circuit board 100 will be described with reference to FIGS. 5 and 6, and the stacked structure of the flexible circuit board 100 will be described with reference to FIG. 7.

Figure 5:
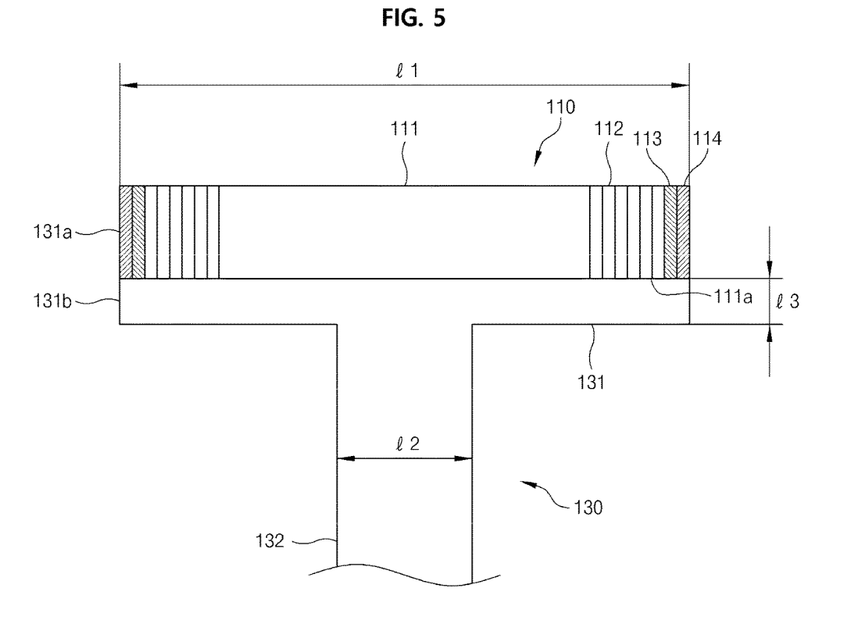
FIG. 5 is an expanded view of an electrode bonding portion of the durable flexible circuit board of FIG. 4.

FIG. 4 is a schematic plan view illustrating a durable flexible circuit board for a transparent display board, according to one embodiment of the invention, and FIG. 5 is a plan view illustrating the electrode bonding portion of the durable flexible circuit board.

With reference to FIGS. 4 and 5, the electrode bonding portion 110 includes an electrode terminal substrate 111 made of a hard material, and a plurality of electrode terminals 112, 113, and 114 provided on one surface of the electrode terminal substrate 111 and made of a conductive material.

The electrode terminals 112, 113, and 114 are formed by patterning a metal layer formed on the surface of the electrode terminal substrate 111. Specifically, the electrode terminals 112 serve as signal connection terminals 112 for transferring the control signals generated by the controller 310, the electrode terminals 113 serve as a pair of power connection terminals 113 that are disposed outside the outermost signal connection terminals 112 and which transfer electric power, and the electrode terminals 114 serve as dummy terminals 114.

The pair of power connection terminals 113 output electric power supplied by the power supply 320 to the connection terminals 210 connected to the power line patterns of the transparent plate 200. Here, the pair of power connection terminals 113 are not provided as separate power lines but are integrated with the signal connection terminals 112 transferring the control signals and provided in the flexible circuit board 100. That is, in the flexible circuit board 100, signal lines and power lines are integrated with each other.

The dummy terminals 114 are disposed at periphery portions of the electrode terminal substrate 111. The dummy terminals 114 resist pressure or vibration applied to the outermost connection terminals that are either the signal connection terminals 112 or the power connection terminals 113 and prevent heat generated from the outermost connection terminals from being rapidly discharged out of the flexible circuit board. In addition, the dummy terminals 114 protect the signal connection terminals and the power connection terminals disposed therebetween from an external impact transferred through the transparent plate.

Here, FIG. 5 illustrates an example in which the outermost connection terminals are the power connection terminals. However, the positions of the signal connection terminals 112 and the power connection terminals 113 may be changed. That is, among the connection terminals, the outermost connection terminals may be either the signal connection terminals or the power connection terminals.

The dummy terminals 114 are disposed at the periphery portions of the electrode terminal substrate. That is, even the outermost connection terminals (the signal connection terminals or the power connection terminals) are disposed between the dummy terminals 114. Therefore, the dummy terminals 114 resist the pressure or vibration applied to themselves and the outermost connection terminals as with each inside connection terminal resisting the pressure or vibration applied to the neighboring connection terminals.

Therefore, the outermost connection terminals, among the signal connection terminals 112 and the power connection terminals 113, generate the same amount of heat as the heat generated by the inside connection thermals because the pressure or vibration applied to the outermost connection terminals can be resisted by the dummy terminals 114 as with the pressure or vibration applied to the inside connection terminals.

In addition, according to the invention, the outermost connection terminals among the signal connection terminals 112 and the power connection terminals 113 are not actually disposed at the outermost sides because they are disposed between the dummy terminals. Therefore, the heat generated from the outermost connection terminals may not be rapidly discharged to the outside through the transparent plate 200 because the heat is blocked by the dummy terminals 114. Therefore, heat loss is reduced compared with conventional arts.

That is, the dummy terminals 114 prevent bonding force irregularity that occurs due to a difference in vibration and pressure between the inside connection terminals and the outermost connection terminals.

The electrode terminal substrate 111 is a hard substrate and has a predetermined length and width. For example, the electrode terminal substrate 111 is shaped such that the length l1 of a boundary line 110a between the electrode terminal substrate 111 and the flexible film portion 130 is longer than the length l2 of the width of the flexible film portion 130, thereby increasing a bonding area.

To this end, the flexible film portion 130 includes an expanded portion 131 having a larger size in a widthwise direction than the electrode terminal substrate 111 and an extended portion 132 having a smaller size in the widthwise direction than the expanded portion 131.

Due to the increased bonding area where the electrode terminal substrate 111 of the electrode bonding portion and the expanded portion 131 of the flexible film portion 130 are bonded to each other, bonding force is increased, resulting in improvement in durability of the flexible circuit board. Therefore, the present invention can prevent the flexible circuit board from being damaged by vibration during ultrasonic bonding.

Figure 6:
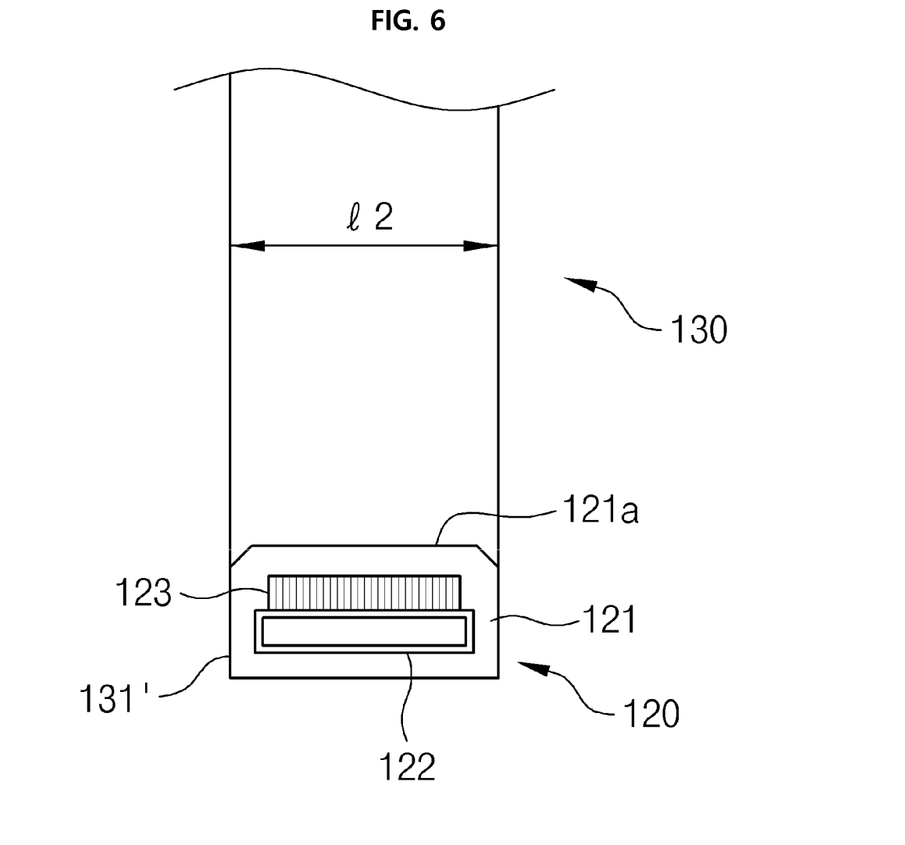
FIG. 6 is an expanded view of a driver connection portion of the durable flexible circuit board of FIG. 4.

FIG. 6 is a plan view illustrating the driver connection portion of the durable flexible circuit board according to the embodiment of the invention.

With reference to FIG. 6, the driver connection portion 120 is disposed at the other end of the flexible film portion 130. The driver connection portion 120 includes a connector mounting substrate 121 made of a hard material, connector terminals 123 that can be electrically connected to the wires of the flexible film portion 130, and the connector 330 that can be electrically connected to the connector terminals 123 and is connected to the wire extending from the driver board 300.

The connector mounting substrate 121 is stacked on the upper surface and the lower surface of the flexible film portion 130 and has enough rigidity not to be bendable or flexible. Here, the length of a boundary line 120a between the connector mounting substrate 121 and the flexible film portion 130 is longer than the length l2 of the width of the extended portion of the flexible film portion 130. That is the boundary line 120a includes a horizontal portion and an oblique portion. The boundary line 120a between the connector mounting substrate 121 and the flexible film portion 130 is longer than the width of the flexible film portion 130.

In this way, it is possible to increase a bonding area between the flexible film portion 130 made of a flexible material and the connector mounting substrate 121 made of a hard material, thereby improving durability, namely the ability to endure an external impact.

Figure 7:
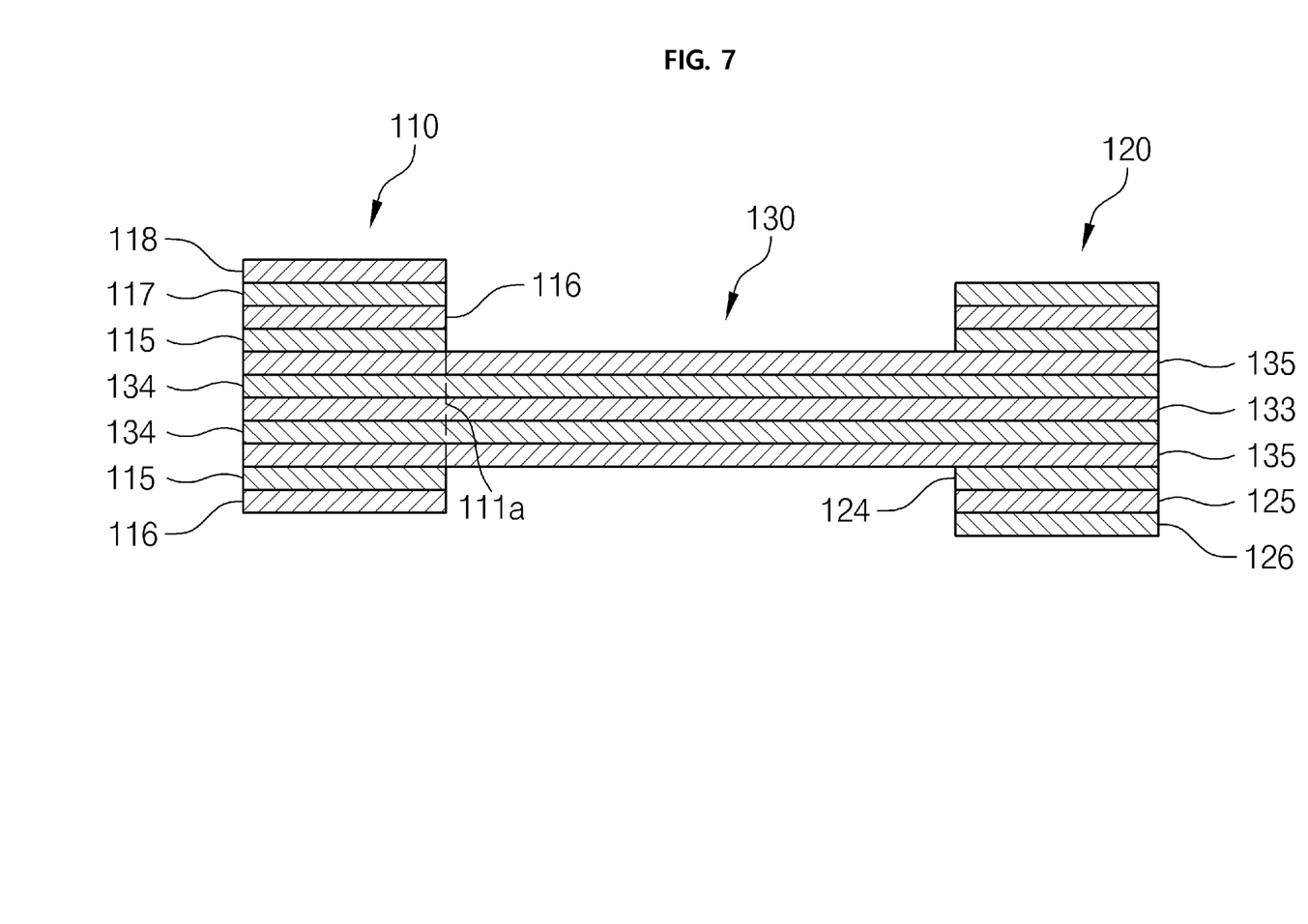
FIG. 7 is a cross-sectional view illustrating a stacked structure of the durable flexible circuit board according to the embodiment of the invention.

FIG. 7 is a cross-sectional view illustrating the stacked structure of the flexible circuit board 100.

With reference to FIG. 7, the flexible film portion 130 of the flexible circuit board 100 includes a base film 133 made of plastic, first metal layers 134 respectively provided on the upper surface and the lower surface of the base film 133 to serve as wires, and first protective layers 135 stacked on the first metal layers 134.

The base film 133 is a thin film made of, for example, polyimide.

The first metal layers 134 are stacked on the upper surface and the lower surface of the base film 133 and serve as the wires that electrically connect the electrode terminals of the electrode bonding portion 110 and the connector terminal 123 of the driver connection portion 120 to each other.

The first protective layers 135 are made of, for example, a complex film prepared by coating a polyimide film with a heat-curable flame-retardant epoxy adhesive. The first protective layers 135 are cover layers to improve electric insulation, flame retardancy, and thermal resistance of the base film 133 and the first metal layers 134.

That is, the flexible film portion 130 is made up of the base film 133, the first metal layers 134, and the first protective layers 135. Thus, the flexible film portion is a thin substrate that is bendable and flexible.

The electrode bonding portion 110 includes an upper portion and a lower portion respectively stacked on the upper surface and the lower surface of a portion of the flexible film portion 130. The upper portion of the electrode bonding portion 110 includes a first reinforced resin layer 115 stacked on the first protective layer 135, a second metal layer 116 stacked on the first reinforced resin layer 115, a first coating layer 117 stacked on the second metal layer 116, and a second protective layer 118 stacked on the first coating layer 117. Meanwhile, the lower portion of the electrode bonding portion 110 includes a first reinforced resin layer 115 formed on the first protective layer 135 and a second metal layer 116 formed on the first reinforced resin layer 115.

The first reinforced resin layers 115 are stacked on the first protective layers 135. That is, the first reinforced resin layers 115 are provided on both of the upper side and the lower side of the electrode bonding portion 10. The first reinforced resin layers 115 are made of a material that can improve durability of the electrode bonding portion 110, for example, unsaturated resin or molding resin made from a vinyl compound such as styrene.

The second metal layers 116 are made of a copper-plated thin film and are used as the electrode terminals 112, 113, and 114 of the electrode bonding portion 110. The second metal layers 116 are provided at both the upper side and the lower side of the electrode bonding portion. Here, only the second metal layer 116 at the lower side of the electrode bonding portion is exposed to serve as the electrode terminals 112, 113, and 114 and is brought into tight contact with the connection terminals 210 of the transparent plate 200.

The first coating layer 117 is stacked on the second metal layer 116. The first coating layer 117 is formed by coating the upper surface of the second metal layer 116 with a coating agent, for example, PSR ink.

The second protective layer 118 is provided only at the upper side of the electrode bonding portion 110 to prevent the electrode bonding portion 110 from being damaged by high temperature heat. For example, the second protective layer 118 is a heat-resistant tape (for example, Kapton tape) attached to the upper surface of the first coating layer 117 via an adhesive. The second protective layer 118 protects the electrode bonding portion from heat and cold air generated from the transparent plate 200 and surroundings thereof.

In order to achieve the object of the invention, the electrode bonding portion 110 is structured such that the first reinforced resin layer 115 and the second protective layer 118 are provided and the length of the boundary lines 110a and 120a between the electrode bonding portion 110 and the flexible film portion 130 are increased to be longer than the width of the flexible film portion 130. According to the invention, the combination of these features improves the durability of the flexible circuit board.

The driver connection portion 120 is disposed at the opposite side of the electrode bonding portion 110. The driver connection portion 120 includes second reinforced resin layers 124 stacked on the first protective layers 135, third metal layers 125 stacked on the second reinforced resin layers 124, and second coating layers 126 stacked on the third metal layers 125.

The second reinforced resin layers 124 are stacked on the first protective layers provided on the upper side and the lower side of the flexible film portion 130. The second resin layers 124 are made of, for example, pre-preg, thereby improving the durability of the flexible circuit board.

The third metal layers 125 are made copper plating layers 125 and serve as the connector terminals 123 of the driver connection portion 120.

The second coating layers 126 are stacked on the third metal layers 125, thereby protecting the third metal layers 125. The second coating layers 126 may be PSR ink layers.

The driver connection portion 120 includes an upper portion and a lower portion, each portion including the second reinforced resin layer 124 and the second coating layer 126. Thus, the upper portion and the lower portion of the driver connection portion 120 are respectively stacked on the upper surface and the lower surface of the flexible film portion 130 composed of the base film 133 and the first protective layers 135, thereby constituting the connector mounting substrate 121 that is not bendable. The connector mounting substrate 121 has a width larger than that of the flexible film portion 130. Therefore, the bonding area can be increased compared with conventional arts.

The present invention has the structure described above. Hereinafter, operation of the present invention will be described with reference to an assembling method of the flexible circuit board 100.

Figure 8:
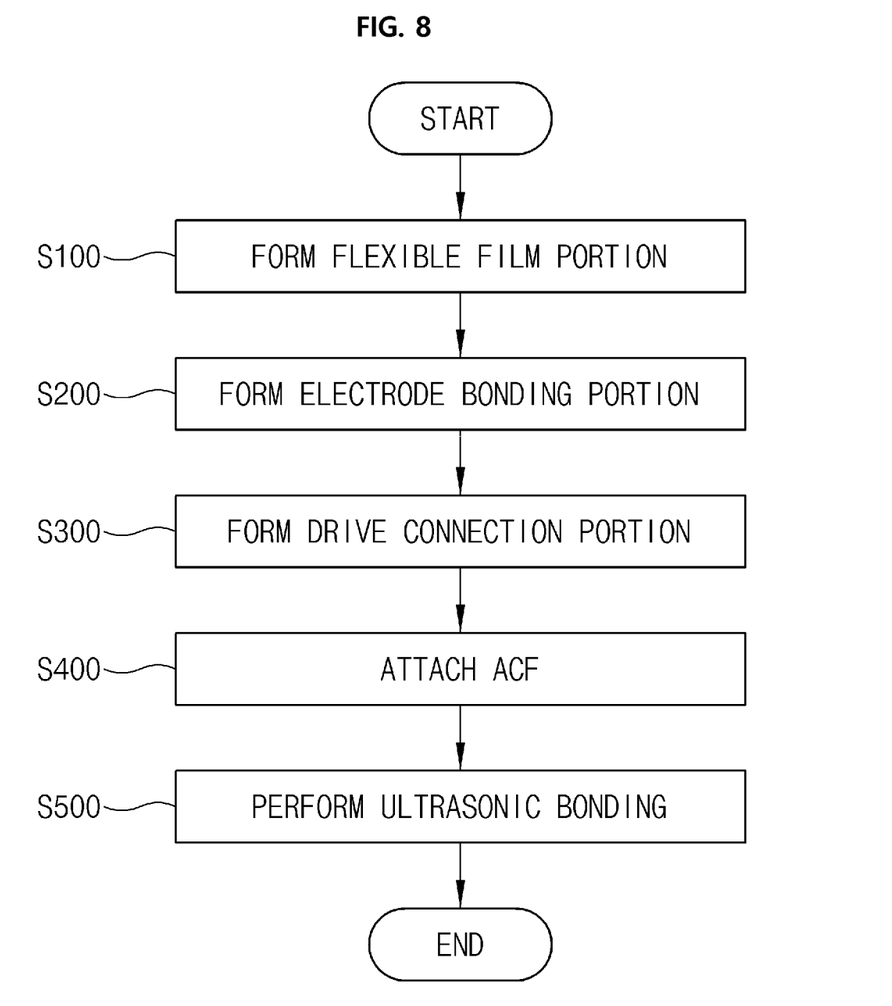
FIG. 8 is a flowchart illustrating a method of assembling the durable flexible circuit board according to the embodiment of the invention.

FIG. 8 is a flowchart showing the assembling method of the durable flexible circuit board for a transparent display board, according to one embodiment of the invention.

With reference to FIG. 8, the assembling method includes steps of preparing the flexible film portion (Step S100), stacking the electrode bonding portion 110 on the flexible film portion 130 (Step S200), stacking the driver connection portion 120 on the flexible film portion 130 (Step S300), attaching an anisotropic conductive film (ACF) 400 to the connection terminals 210 of the transparent plate 200 (Step S400), and stacking and fusing the electrode bonding portion 110 on the ACF 400 (Step S500).

At Step S100, the first layers 134 are formed on the upper surface and the lower surface of the base film 133, and the first protective layers 135 are stacked on the surfaces of the first metal layers 134, thereby preparing the flexible film portion 130. The first metal layers 134 are copper-plated thin films and serve as wires to transfer signals and electric power. The base film 133 and the first protective layers 135 have a small thickness. Accordingly, the flexible film portion 130 is a flexible film substrate that can be freely bent and flexed.

At Step S200, the electrode bonding portion 110 is stacked on the flexible film portion 130 prepared at Step S100. The electrode bonding portion 110 is formed by stacking the first reinforced resin layers 115 on the first protective layers 135 respectively formed on the upper surface and the lower surface of a portion of the flexible film portion 130, stacking the second metal layers on the first reinforced resin layers 115, stacking the first coating layer 117 on the upper second metal layer 116, and finally stacking the second protective layer 118 on the upper first coating layer 117.

As described above, the first reinforced resin layers 115 are made of a reinforcing material, for example, complex fiber such as pre-preg, thereby increasing the rigidity of the flexible circuit board. The first reinforced resin layers 115 serve as the electrode terminal substrate 111.

The second metal layers 116 are stacked on the first reinforced resin layers 115. The lower second metal layer 116 of the second metal layers 116 is partially exposed to serve as the electrode terminals. The electrode terminals include the dummy terminals 114, the power connection terminals 113, and the signal connection terminals 112.

The first coating layer 117 is stacked on the second metal layer 116 by coating the surface of the second metal layer 116 with PSR ink. The first coating layer 117 is a glossy layer and can prevent moisture or foreign matter from permeating into the second metal layers 116.

The second protective layer 118 is a heat resistant film and is attached to the surface of the first coating layer 117 via an adhesive.

Figure 9:
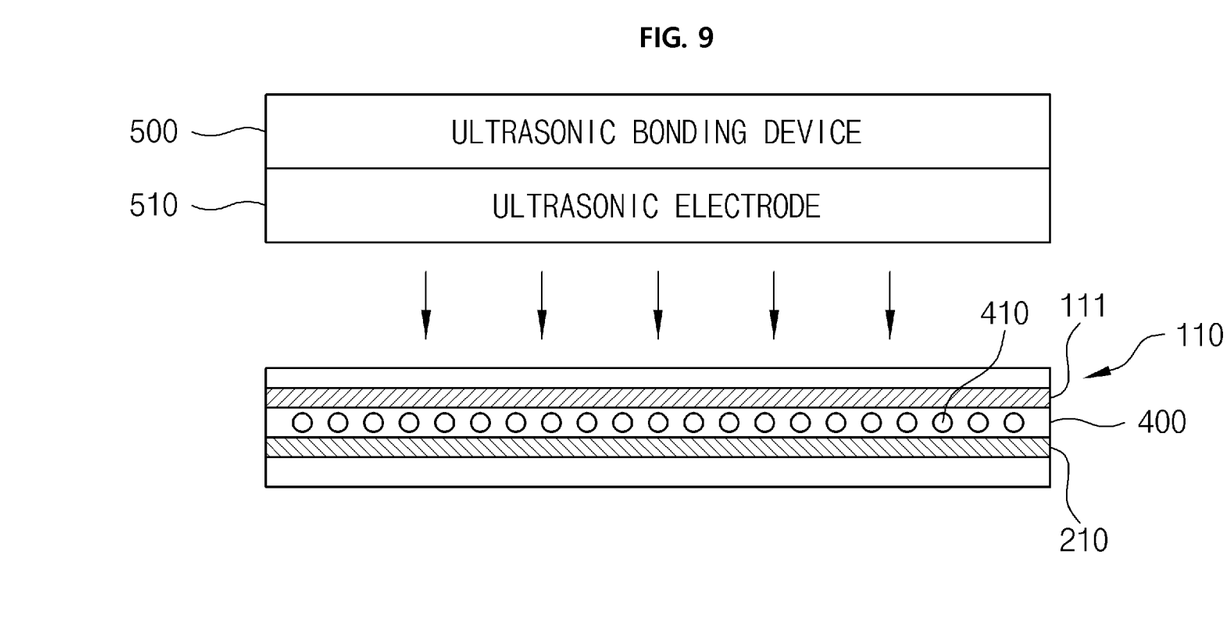
FIG. 9 is a schematic view illustrating a method of assembling the durable flexible circuit board according to the embodiment of the invention.

The first coating layer 117 and the second protective layer 118 are formed on the upper second metal layer 116 which does not come into contact with the connection terminals 210 of the transparent plate 200. That is, as shown in FIG. 7, only either the upper surface or the lower surface of the electrode bonding portion 110 is bonded to the connection terminals 210 of the transparent plate 200, and the other surface provides a portion on which an ultrasonic electrode 510 of an ultrasonic bonding device 500 is placed and pressed.

That is, the first coating layer 117 and the second protective layer 118 are provided on the surface on which the ultrasonic electrode 510 of the ultrasonic bonding device 500 is pressed, thereby preventing the flexible film portion 130 from being damaged by vibration during ultrasonic bonding.

At Step S300, the driver connection portion 120 is stacked on the flexible film portion 130, at a position opposite to the electrode bonding portion 110. Specifically, the second reinforced resin layers 124 are formed on the first protective layers 135 on the upper surface and the lower surface of the flexible film portion 130, the third metal layers 125 are then stacked on the second reinforced resin layers 124, and the third protective layers 126 are finally stacked on the third metal layers 125.

The second reinforced resin layers 124 constitute the connector mounting substrate 121, and the third metal layers 125 constitute the connector terminals 123 connected to the wires formed in the connector mounting substrate 121 and connected to the connector 330. The third protective layers 126 are formed on the connector mounting substrate to prevent permeation of moisture or foreign matter.

The connector 330 is attached to the connector mounting substrate 330 via a curing agent or a liquid adhesive after the driver connection portion 120 is formed through the above-described sequence. The connector 330 undergoes a curing process performed by a UV curing device after the curing agent or the adhesive is coated.

At Step S400, the ACF 400 is attached to the connection terminals 210 of the transparent plate 200. The ACF 400 is a film coated with an adhesive and provided with a plurality of conductive balls 410. The ACF 400 is provisionally adhered to the connection terminals 210 of the transparent plate 200 via a liquid adhesive.

In the embodiment described above, the ACF 400 is adhered to the transparent plate 200 at Step S400 and then Step 500 is performed. However, another embodiment is possible. That is, after the ACF 400 is provisionally adhered to the flexible circuit board 100, the ACF 400 may be securely fused through ultrasonic bonding at Step S500. The term "provisionally adhered" means that the ACF 400 is adhered to the flexible circuit board 100 by the adhesive force of an adhesive.

At Step S500, the flexible circuit board 100 prepared through Step S100 to Step S300 is bonded to the connection terminals 210 of the transparent plate 200 through ultrasonic fusing. The exposed lower surface of the second metal layer 116 of the electrode bonding portion 110 is brought into tight contact with the connection terminals 210 of the transparent plate 200. At this time, the signal connection terminals 112 come into contact with the connection terminals 210 connected to the signal line patterns of the transparent plate 200 and the power connection terminals 113 come into contact with the connection terminals 210 connected to the power line patterns of the transparent plate 200. The dummy terminals 114 are provided at the outermost sides of the terminal group including the connection terminals.

The ultrasonic bonding device 500 outputs ultrasonic waves after an interposing plate made of silicone is put on the upper side (for example, the second protective layer 118) of the electrode bonding portion 110. The ultrasonic bonding device generates ultrasonic vibration and applies the ultrasonic vibration and pressure to the ACF 400 and the flexible circuit board, through the interposing plate (not shown). Therefore, the adhesive in the ACF 400 is melted by heat generated by the pressure and ultrasonic vibration, and the conductive balls 410 in the ACF 400 are fused and crushed by the ultrasonic vibration and the pressure. Thus, the conductive balls are bonded to the signal connection terminals and the power connection terminals of the flexible circuit board 100.

At this time, since the dummy terminals 114 are provided outside the outermost connection terminals (the signal connection terminals 112 or the power connection terminals 113), the bonding force of the signal connection terminals 112 or the power connection terminals 113 is increased.

Specifically, due to the presence of the dummy terminals 114, the outermost connection terminals 112 or 113 are not disposed at the periphery portions of the flexible circuit board 100 but are disposed inside the dummy terminals. Therefore, the pressure applied to the outermost connection terminals 112 or 113 can be distributed to the dummy terminals. In addition, the heat generated from the outermost connection terminals 112 or 113 and discharged to the outside is blocked. Therefore, the temperature distribution may be uniform over the all connection terminals 112 and 113.

Since the temperature distribution and the pressure distribution over all the connection terminals 112 and 113 become uniform due to the dummy terminals 114, the melted adhesive can be cured at the same time on all of the connection terminals 112 and 113, resulting in decrease in manufacturing time and increase in bonding force.

That is, the ultrasonic bonding method for bonding the transparent plate 200 and the flexible circuit board 100 can reduce the bonding time, thereby increasing production productivity as compared with a conventional bonding method using a hot bar because heating and curing occur in a very short time.

Exemplary embodiments of a durable flexible circuit board for a transparent display board have been described for illustrative purpose, but those skilled in the art will appreciate that various modifications and equivalents are possible, without departing from the spirit of the invention.

Therefore, all modifications, equivalents, and substitutions should be construed to fall within the scope of the invention defined by the accompanying claims.

What is claimed is:

1. A durable flexible circuit board for a transparent display board, the durable flexible circuit board comprising:
    a transparent plate provided with a plurality of light emitting elements that emit light in response to control signals and electric power transferred through wire patterns formed in a transparent electrode formed on one surface of the transparent plate;
    a driver board provided with at least any one of a controller supplying the control signals to the light emitting elements and a power supply supplying electric power to the light emitting elements; and
    a flexible circuit board in which signal lines for transferring the control signals from the driver board to the transparent plate and power lines for transferring the electric power are integrated, the flexible circuit board comprising:
        an electrode bonding portion bonded to the transparent plate, the electrode bonding portion comprising: a plurality of signal connection terminals transferring the control signals to the transparent plate;
        at least one power connection terminal transferring the electric power to the transparent plate; and
        at least one dummy terminal that resists pressure and vibration applied to the signal connection terminal or the power connection terminal that is disposed adjacent to the dummy terminal and is disposed at the outermost side among the connection terminals and the power connection terminals.

2. The durable flexible circuit board according to claim 1, wherein the flexible circuit board further comprises:
    a driver connection portion including a connector mounting substrate on which a connector connected to a power line and a signal line extending from the driver board is mounted; and
    a flexible film portion made of a flexible material and connecting the electrode bonding portion and the driver connection portion to each other.

3. The durable flexible circuit board according to claim 2, wherein the electrode bonding portion comprises an electrode terminal substrate that is bonded to the flexible film portion and on which the signal connection terminals, the power connection terminal, and the dummy terminal are formed, and a size of the electrode terminal substrate in a widthwise direction is equal to or larger than a size of the flexible film portion in the widthwise direction, thereby increasing a bonding area.

4. The durable flexible circuit board according to claim 2, wherein the driver connection portion is shaped such that a size of a boundary line between the connector mounting substrate and the flexible film portion is larger than a size of the flexible film portion in a widthwise direction.

5. The durable flexible circuit board according to claim 1, wherein the electrode bonding portion is bonded through ultrasonic bonding.

6. The durable flexible circuit board according to claim 2, wherein the flexible film portion comprises first metal layers stacked on an upper surface and a lower surface of a base film made of a flexible material, and first protective layers serving as cover layers and stacked on the first metal layers;
    the electrode bonding portion comprises first reinforcing resin layers stacked on the first protective layers at an end portion the flexible film portion to increase a rigidity of the electrode bonding portion, second metal layers stacked on the first reinforcing resin layers and serving as electrode terminals, a first coating layer coated on the second metal layer to prevent permeation of moisture or foreign matter into the electrode terminals, and a second protective layer made of a heat resistant resin and attached to an upper surface of the first coating layer; and
    the first coating layer and the second protective layer are formed only at either an upper side or a lower side of the electrode bonding portion.

7. An assembling method of a durable flexible printed circuit board for a transparent display board, the assembling method comprising:
    (a) preparing the flexible circuit board according to claim 1;
    (b) stacking an anisotropic conductive film (ACF) and the flexible circuit board on connection terminals connected to wire patterns of a transparent electrode, the wire patterns transferring electric power and control signals to light emitting elements provided on a transparent plate, wherein the stacking of the anisotropic conductive film and the flexible circuit board is performed by either one of the followings:
        (b-1) provisionally adhering the anisotropic conductive film to the transparent plate and then stacking the flexible circuit board on the anisotropic conductive film; and
        (b-2) provisionally adhering the anisotropic conductive film to the electrode bonding portion of the flexible circuit board and then stacking the electrode bonding portion of the flexible circuit board on the transparent plate;
    (c) bonding the electrode bonding portion of the flexible circuit board to the connection terminals through ultrasonic bonding.

* * * * *